(12) United States Patent
Van Weert et al.

(10) Patent No.: US 8,436,984 B2
(45) Date of Patent: May 7, 2013

(54) LITHOGRAPHIC APPARATUS AND METHOD OF IRRADIATING AT LEAST TWO TARGET PORTIONS

(75) Inventors: Cornelis Lambertus Maria Van Weert, Utrecht (NL); Marcus Adrianus Van De Kerkhof, Helmond (NL); Bearrach Moest, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 614 days.

(21) Appl. No.: 12/639,744

(22) Filed: Dec. 16, 2009

(65) Prior Publication Data

US 2010/0157271 A1 Jun. 24, 2010

Related U.S. Application Data

(60) Provisional application No. 61/193,721, filed on Dec. 18, 2008, provisional application No. 61/234,419, filed on Aug. 17, 2009.

(51) Int. Cl.
*G03B 27/72* (2006.01)
*G03B 27/32* (2006.01)

(52) U.S. Cl.
USPC .............................................. 355/71; 355/77

(58) Field of Classification Search ..................... 355/71, 355/34
See application file for complete search history.

(56) References Cited

U.S. PATENT DOCUMENTS

| | | | |
|---|---|---|---|
| 4,509,852 A | 4/1985 | Tabarelli et al. | |
| RE38,320 E * | 11/2003 | Nishi et al. | 355/67 |
| 7,528,929 B2 * | 5/2009 | Streefkerk et al. | 355/30 |
| 7,561,250 B2 * | 7/2009 | Liebregts et al. | 355/53 |
| 2004/0136494 A1 | 7/2004 | Lof et al. | |
| 2004/0207824 A1 | 10/2004 | Lof et al. | |
| 2006/0038968 A1 | 2/2006 | Kemper et al. | |
| 2006/0119809 A1 | 6/2006 | Verhagen et al. | |

(Continued)

FOREIGN PATENT DOCUMENTS

| | | |
|---|---|---|
| EP | 0 443 803 A | 8/1991 |
| EP | 1 420 299 A | 5/2004 |

(Continued)

OTHER PUBLICATIONS

Chinese Office Action dated Jun. 20, 2011 in corresponding Chinese Patent Application No. 200910260603.4.

(Continued)

*Primary Examiner* — Toan Ton
*Assistant Examiner* — Michelle Iacoletti
(74) *Attorney, Agent, or Firm* — Pillsbury Winthrop Shaw Pittman LLP

(57) ABSTRACT

A lithographic apparatus is disclosed that includes a table, at least two target portions on the table or on an object on the table, and a surface material between the at least two target portions. The apparatus further includes an optical system configured to project a beam of radiation, along an optical path towards the table, with a cross-section to irradiate the at least two target portions at the same time. The apparatus further includes a shield moveable into the optical path to restrict the cross-section of the beam of radiation to restrict illumination between the at least two target portions, wherein the surface material between the at least two target portions would degrade when irradiated with radiation from the optical system.

20 Claims, 4 Drawing Sheets

U.S. PATENT DOCUMENTS

| | | | |
|---|---|---|---|
| 2006/0290911 A1* | 12/2006 | Jung | 355/53 |
| 2007/0258072 A1 | 11/2007 | Nagasaka et al. | 355/53 |
| 2008/0036986 A1 | 2/2008 | Yamaguchi | |
| 2008/0212046 A1 | 9/2008 | Riepen et al. | |
| 2009/0233233 A1* | 9/2009 | Six et al. | 430/289.1 |

FOREIGN PATENT DOCUMENTS

| | | |
|---|---|---|
| EP | 1 420 300 A2 | 5/2004 |
| EP | 1 783 822 | 5/2007 |
| JP | 4-155913 A | 5/1992 |
| JP | 2006-324619 | 11/2006 |
| JP | 2008-046210 | 2/2008 |
| KR | 10-2008-0014577 | 2/2008 |
| WO | WO 99/49504 A1 | 9/1999 |
| WO | WO 2005/064405 A2 | 7/2005 |

OTHER PUBLICATIONS

Extended Search Report as issued for European Patent Application No. 09178801.8, dated Mar. 26, 2010.

Korean Office Action dated Apr. 18, 2011 in corresponding Korean Patent Application No. 10-2009-0126968.

U.S. Appl. No. 61/071,621, filed May 8, 2008, Direcks et al.

U.S. Appl. No. 61/136,380, filed Sep. 2, 2008, Tanasa et al.

U.S. Appl. No. 61/064,487, filed Mar. 7, 2008, Kivits et al.

* cited by examiner

Fig. 8
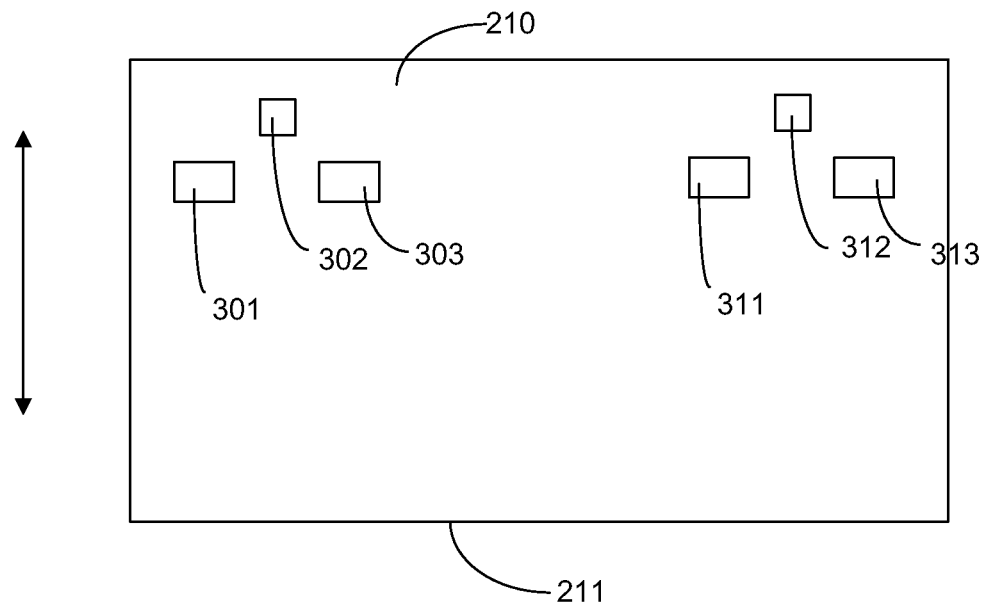
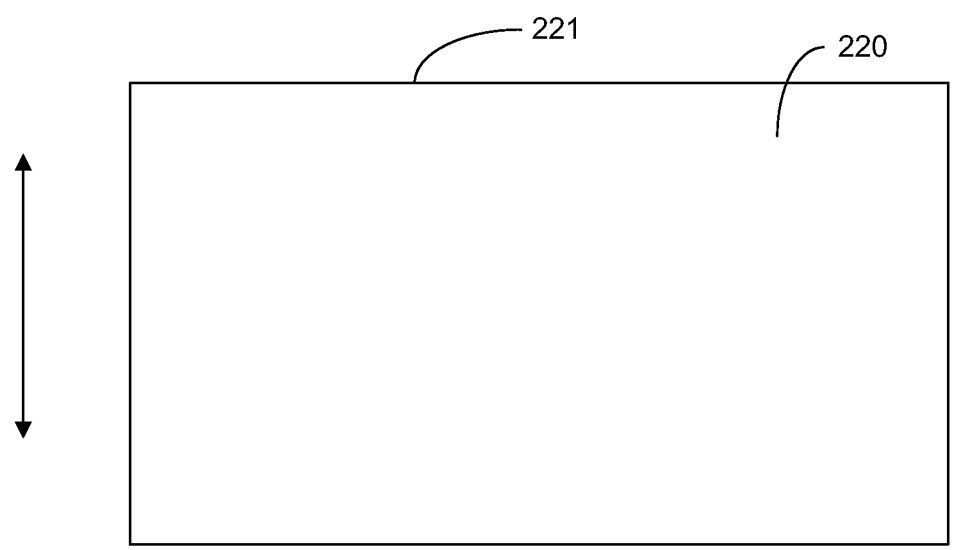

LITHOGRAPHIC APPARATUS AND METHOD OF IRRADIATING AT LEAST TWO TARGET PORTIONS

This application claims priority and benefit under 35 U.S.C. §119(e) to U.S. Provisional Patent Application Ser. No. 61/193,721, entitled "Lithographic Apparatus and Method of Irradiating at Least Two Target Portions", filed on Dec. 18, 2008, and to U.S. Provisional Patent Application Ser. No. 61/234,419, entitled "Lithographic Apparatus and Method of Irradiating at Least Two Target Portions", filed on Aug. 17, 2009. The contents of those applications are incorporated herein in their entirety by reference.

FIELD

The invention relates to a lithographic apparatus and a method of irradiating at least two target portions.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

It has been proposed to immerse the substrate in the lithographic projection apparatus in a liquid having a relatively high refractive index, e.g. water, so as to fill a space between the final element of the projection system and the substrate. In an embodiment, the liquid is distilled water, although another liquid can be used. An embodiment of the invention will be described with reference to liquid. However, another fluid may be suitable, particularly a wetting fluid, an incompressible fluid and/or a fluid with higher refractive index than air, desirably a higher refractive index than water. Fluids excluding gases are particularly desirable. The point of this is to enable imaging of smaller features since the exposure radiation will have a shorter wavelength in the liquid. (The effect of the liquid may also be regarded as increasing the effective numerical aperture (NA) of the system and increasing the depth of focus.) Other immersion liquids have been proposed, including water with solid particles (e.g. quartz) suspended therein, or a liquid with a nano-particle suspension (e.g. particles with a maximum dimension of up to 10 nm). The suspended particles may or may not have a similar or the same refractive index as the liquid in which they are suspended. Other liquids which may be suitable include a hydrocarbon, such as an aromatic, a fluorohydrocarbon, and/or an aqueous solution.

Submersing the substrate or substrate and substrate table in a bath of liquid (see for example U.S. Pat. No. 4,509,852) means that there is a large body of liquid that must be accelerated during a scanning exposure. This requires additional or more powerful motors and turbulence in the liquid may lead to undesirable and unpredictable effects.

In an immersion apparatus, immersion fluid is handled by a fluid handling system, structure or apparatus. In an embodiment the fluid handling system may supply immersion fluid and therefore be a fluid supply system. In an embodiment the fluid handling system may at least partly confine immersion fluid and thereby be a fluid confinement system. In an embodiment the fluid handling system may form a barrier to immersion fluid and thereby be a barrier member, such as a fluid confinement structure. In an embodiment the fluid handling system may create or use a flow of gas, for example to help in controlling the flow and/or the position of the immersion fluid. The flow of gas may form a seal to confine the immersion fluid so the fluid handling structure may be referred to as a seal member; such a seal member may be a fluid confinement structure. In an embodiment, immersion liquid is used as the immersion fluid. In that case the fluid handling system may be a liquid handling system. In reference to the aforementioned description, reference in this paragraph to a feature defined with respect to fluid may be understood to include a feature defined with respect to liquid.

One of the arrangements proposed is for a liquid supply system to provide liquid on only a localized area of the substrate and in between the final element of the projection system and the substrate using a liquid confinement system (the substrate generally has a larger surface area than the final element of the projection system). One way which has been proposed to arrange for this is disclosed in PCT patent application publication no. WO 99/49504. As illustrated in FIGS. 2 and 3, liquid is supplied by at least one inlet onto the substrate, desirably along the direction of movement of the substrate relative to the final element, and is removed by at least one outlet after having passed under the projection system. That is, as the substrate is scanned beneath the element in a −X direction, liquid is supplied at the +X side of the element and taken up at the −X side. FIG. 2 shows the arrangement schematically in which liquid is supplied via inlet and is taken up on the other side of the element by outlet which is connected to a low pressure source. The arrows above the substrate W illustrate the direction of liquid flow, and the arrow below the substrate W illustrates the direction of movement of the substrate table. In the illustration of FIG. 2 the liquid is supplied along the direction of movement of the substrate relative to the final element, though this does not need to be the case. Various orientations and numbers of in- and out-lets positioned around the final element are possible, one example is illustrated in FIG. 3 in which four sets of an inlet with an outlet on either side are provided in a regular pattern around the final element. Arrows in liquid supply and liquid recovery devices indicate the direction of liquid flow.

A further immersion lithography solution with a localized liquid supply system is shown in FIG. 4. Liquid is supplied by two groove inlets in the direction towards the substrate as shown by the arrows present on either side of the projection system PS and is removed by a plurality of discrete outlets in the direction away from the substrate as shown by arrows, the outlets arranged radially outwardly of the inlets. The inlets and outlets can be arranged in a plate with a hole in its center and through which the projection beam is projected. Liquid is supplied by one groove inlet on one side of the projection system PS and removed by a plurality of discrete outlets on the other side of the projection system PS, causing a flow of a thin film of liquid between the projection system PS and the substrate W. The choice of which combination of inlet and outlets to use can depend on the direction of movement of the substrate W (the other combination of inlet and outlets being inactive). In the cross-sectional view of FIG. 4, arrows illustrate the direction of liquid flow in and out of the inlets/outlets.

In European patent application publication no. EP 1420300 and United States patent application publication no. US 2004-0136494, the idea of a twin or dual stage immersion lithography apparatus is disclosed. Such an apparatus has two tables for supporting a substrate. Leveling measurements are carried out with a table at a first position, without immersion liquid, and exposure is carried out with a table at a second position, where immersion liquid is present. Alternatively, the apparatus has only one table.

PCT patent application publication WO 2005/064405 discloses an all wet arrangement in which the immersion liquid is unconfined. In such a system the whole top surface of the substrate is covered in liquid. This may be advantageous because then the whole top surface of the substrate is exposed to the substantially same conditions. This has an advantage for temperature control and processing of the substrate. In WO 2005/064405, a liquid supply system provides liquid to the gap between the final element of the projection system and the substrate. That liquid is allowed to leak over the remainder of the substrate. A barrier at the edge of a substrate table prevents the liquid from escaping so that it can be removed from the top surface of the substrate table in a controlled way. Although such a system improves temperature control and processing of the substrate, evaporation of the immersion liquid may still occur. One way of helping to alleviate that problem is described in United States patent application publication no. US 2006/0119809. A member is provided which covers the substrate in all positions and which is arranged to have immersion liquid extending between it and the top surface of the substrate and/or substrate table which holds the substrate.

Many surfaces of an immersion lithographic apparatus are made of a material which is liquidphobic to the immersion liquid used in the apparatus. The material may be a coating applied over an underlying surface. The liquidphobic property of the surface material helps in drying of that surface or in controlling the position of the immersion liquid, for example.

SUMMARY

A difficulty with a liquidphobic material is that such a material may degrade when irradiated with radiation from the optical system. For example, the material may lose its liquidphobic property and may become liquidphilic. The material, such as a coating material, may degrade to release contamination, such as in the form of particles. It is desirable, for example, to provide a lithographic apparatus in which degradation of a surface material, such a coating, is hindered.

According to an aspect, there is provided a lithographic apparatus comprising: a table; at least two target portions on the table or on an object on the table and a surface material between the at least two target portions; an optical system configured to project a beam of radiation, along an optical path towards the table, with a cross-section to irradiate the at least two target portions at the same time; and a shield moveable into the optical path to restrict the cross-section of the beam of radiation to restrict illumination between the at least two target portions, wherein the surface material between the at least two target portions, when irradiated with radiation from the optical system, would: degrade, or deform, or both degrade and deform.

According to an aspect, there is provided a method of irradiating at least two target portions of a table or of an object on a table in a lithography apparatus, wherein a surface material between the at least two target portions degrades when irradiated, the method comprising: projecting a beam of radiation towards the target portions, the beam of radiation having a cross-section large enough to irradiate the at least two target portions at the same time; and restricting the cross-section of the radiation beam to restrict illumination of the surface material between the at least two target portions.

According to an aspect, there is provided a method of irradiating at least two target portions of a table or of an object on a table in a lithography apparatus, wherein a surface material between the at least two target portions deforms when irradiated, the method comprising: projecting a beam of radiation towards the target portions, the beam of radiation having a cross-section large enough to irradiate the at least two target portions at the same time; and restricting the cross-section of the radiation beam to restrict illumination of the surface material between the at least two target portions.

According to an aspect, there is provided a framing member configured to limit the cross-section of a beam of radiation in an optical system of a lithography apparatus, the framing member defining a hole in it to allow radiation to pass therethrough, the hole positioned in a portion of the framing member not needed to limit the cross-section of a beam of radiation during imaging of a substrate.

According to an aspect, there is provided a lithographic apparatus comprising: a table; an optical system configured to project a beam of radiation along an optical path towards the table; a target portion located on the table or on an object supported by the table, wherein a surface material is adjacent to the target portion, the surface material being degradable when irradiated with radiation from the optical system; and a framing member constructed and arranged to be moveable into the optical path, the framing member defining an opening through a body of the framing member, wherein, when the framing member is in the optical path, the radiation beam passes through the opening and the opening is configured to limit the cross-section of the beam of radiation to restrict irradiation by the radiation beam to the target portion.

According to an aspect, there is provided a method of irradiating a target portion located on the table or on an object supported by the table, a surface material being adjacent to the target portion, the surface material being degradable when irradiated, the method comprising: projecting a beam of radiation towards the target portion; and moving a framing member into the path of the beam of radiation so that the cross-section of the beam of radiation is limited by an opening defined in the framing member to restrict irradiation by the beam of radiation to the target portion.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIG. 8 illustrates, in plan, y-direction framing members of an embodiment of the invention.

DETAILED DESCRIPTION

Figure 1:
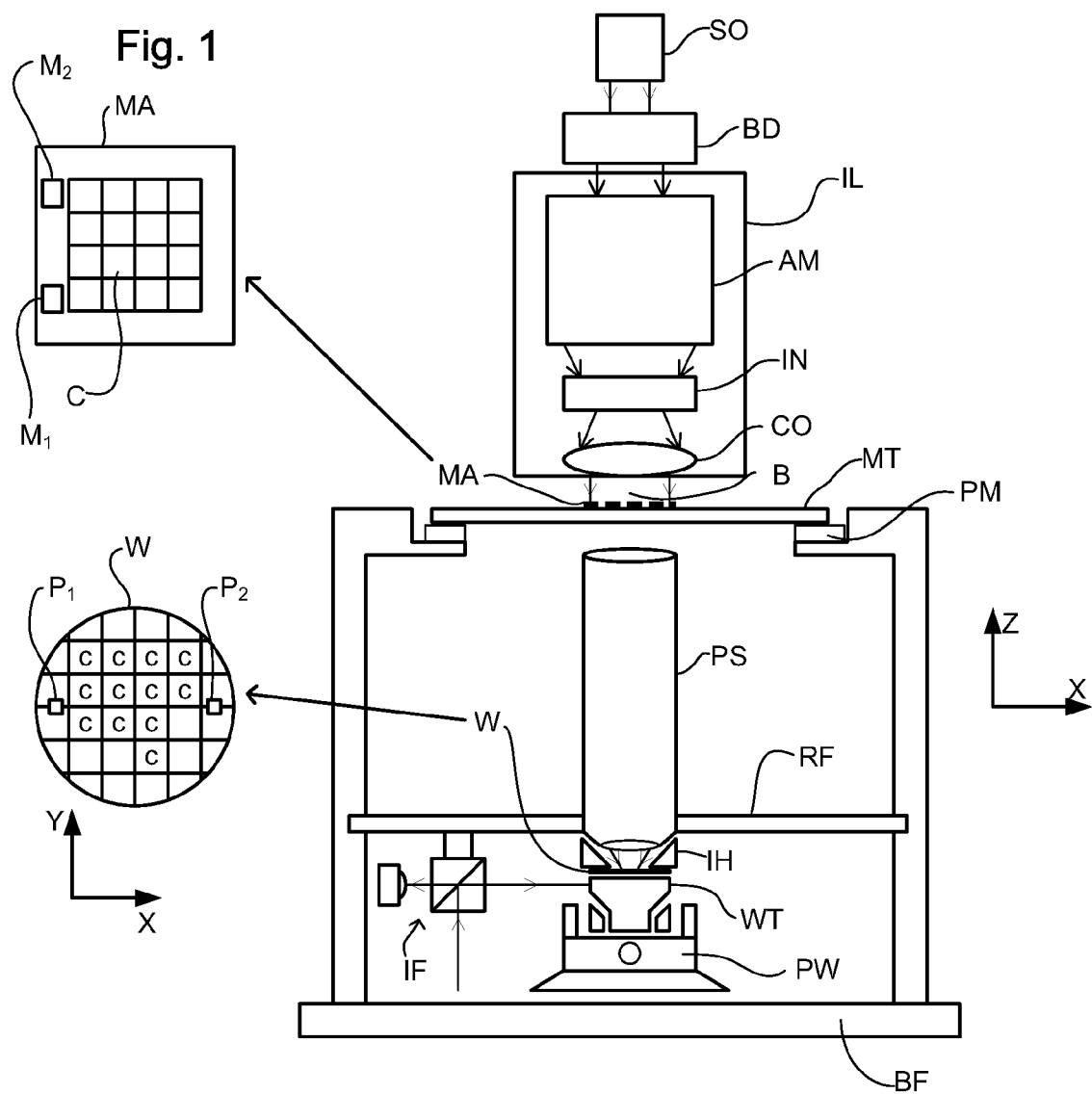
FIG. 1 depicts a lithographic apparatus according to an embodiment of the invention.

FIG. 1 schematically depicts a lithographic apparatus according to one embodiment of the invention. The apparatus comprises:

- an illumination system (illuminator) IL configured to condition a radiation beam B (e.g. UV radiation or DW radiation);
- a support structure (e.g. a mask table) MT constructed to support a patterning device (e.g. a mask) MA and connected to a first positioner PM configured to accurately position the patterning device in accordance with certain parameters;
- a substrate table (e.g. a wafer table) WT constructed to hold a substrate (e.g. a resist-coated wafer) W and connected to a second positioner PW configured to accurately position the substrate in accordance with certain parameters; and
- a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure MT holds the patterning device. The support structure MT holds the patterning device in a manner that depends on the orientation of the patterning device, the design of the lithographic apparatus, and other conditions, such as for example whether or not the patterning device is held in a vacuum environment. The support structure MT can use mechanical, vacuum, electrostatic or other clamping techniques to hold the patterning device. The support structure MT may be a frame or a table, for example, which may be fixed or movable as required. The support structure MT may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more patterning device tables). In such "multiple stage" machines the additional tables may be used in parallel, or preparatory steps may be carried out on one or more tables while one or more other tables are being used for exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AM for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. Having traversed the patterning device MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Arrangements for providing liquid between a final element of the projection system and the substrate can be classed into at least two general categories. These are the bath type (or submersed) arrangement and the localized immersion system. In the submersed arrangement, substantially the whole of the substrate and optionally part of the substrate table is submersed in a liquid, such as in a bath or under a film of liquid. The localized immersion system uses a liquid supply system to provide liquid to only a localized area of the substrate. In the latter category, the space filled by liquid is smaller in plan than the top surface of the substrate. The volume of liquid in the space that covers the substrate remains substantially stationary relative to the projection system while the substrate moves underneath that space.

Figure 2:
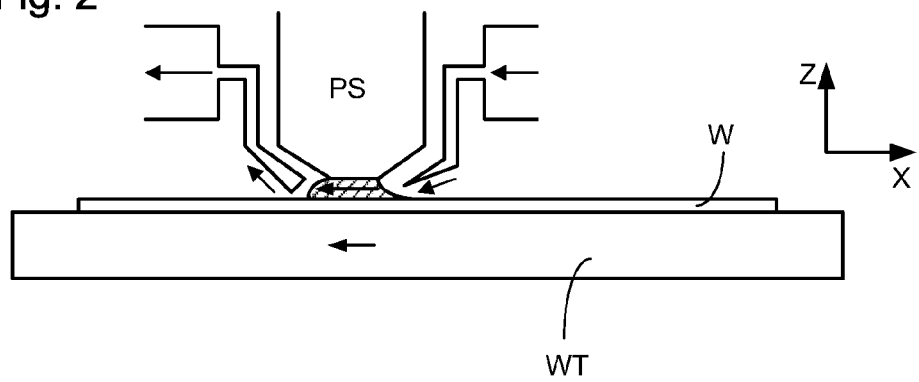
FIGS. 2 and 3 depict a liquid supply system for use in a lithographic projection apparatus.
Figure 3:
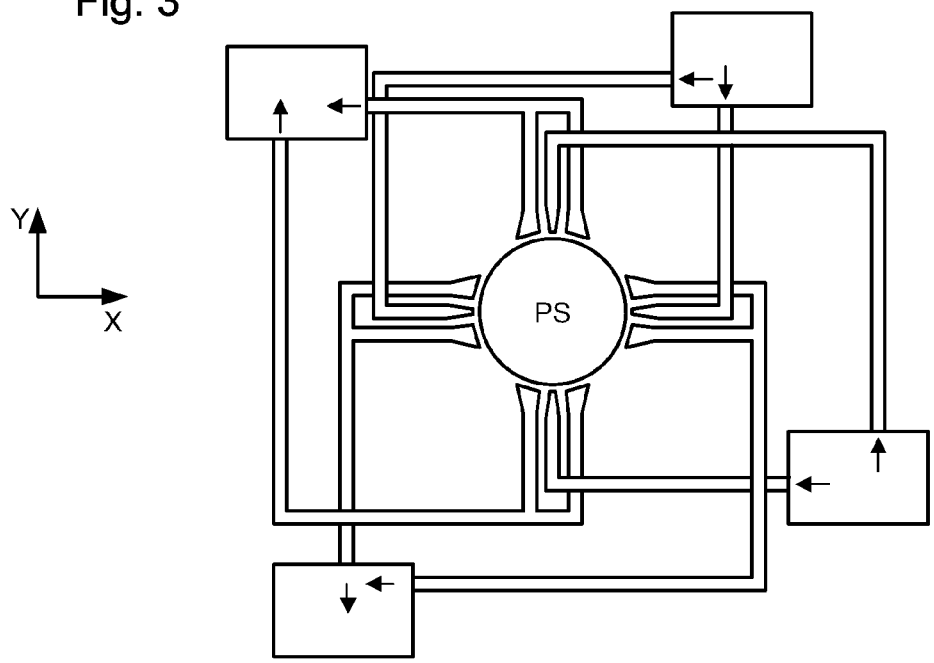
Figure 4:
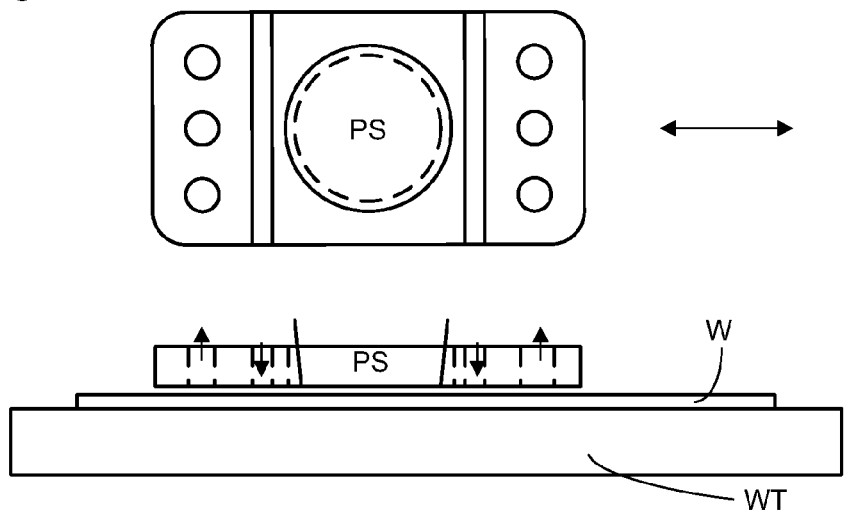
FIG. 4 depicts a further liquid supply system for use in a lithographic projection apparatus.

A further arrangement, to which an embodiment of the present invention may be directed, is the all wet solution in which the liquid is unconfined. In this arrangement, substantially the whole top surface of the substrate and all or part of the substrate table is covered in immersion liquid. The depth of the liquid covering at least the substrate is small. The liquid may be a film, such as a thin film, of liquid on the substrate. Any of the liquid supply devices of FIGS. 2-5 may be used in such a system. However, sealing features are not present in the liquid supply device, are not activated, are not as efficient as normal or are otherwise ineffective to seal liquid to only the localized area. Four different types of localized liquid supply systems are illustrated in FIGS. 2-5. The liquid supply systems disclosed in FIGS. 2-4 are described above.

Figure 5:
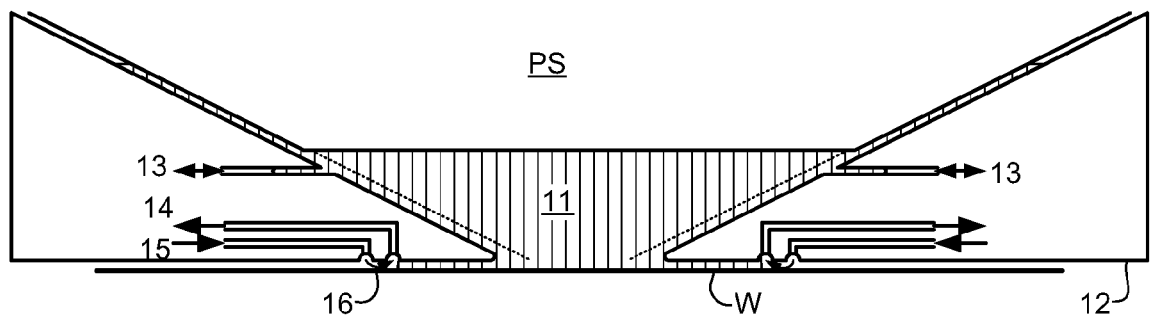
FIG. 5 depicts a further liquid supply system for use in a lithographic projection apparatus.

Another arrangement which has been proposed is to provide the liquid supply system with a fluid confinement structure. FIG. 5 schematically depicts a localized liquid supply system or fluid handling structure with a barrier member or fluid confinement structure 12, which extends along at least a part of a boundary of the space between the final element of the projection system and the substrate table WT or substrate W. (Please note that reference in the following text to surface of the substrate W also refers in addition or in the alternative to a surface of the substrate table, unless expressly stated otherwise.) The fluid confinement structure 12 is substantially stationary relative to the projection system in the XY plane though there may be some relative movement in the Z direction (in the direction of the optical axis). In an embodiment, a seal is formed between the fluid confinement structure and the surface of the substrate W and may be a contactless seal such as a gas seal or fluid seal.

The fluid confinement structure 12 at least partly contains liquid in the space 11 between a final element of the projection system PS and the substrate W. A contactless seal 16 to the substrate W may be formed around the image field of the projection system so that liquid is confined within the space between the substrate W surface and the final element of the projection system PS. The space is at least partly formed by the fluid confinement structure 12 positioned below and surrounding the final element of the projection system PS. Liquid is brought into the space below the projection system and within the fluid confinement structure 12 by liquid inlet 13. The liquid may be removed by liquid outlet 13. The fluid confinement structure 12 may extend a little above the final element of the projection system. The liquid level rises above the final element so that a buffer of liquid is provided. In an embodiment, the fluid confinement structure 12 has an inner periphery that at the upper end closely conforms to the shape of the projection system or the final element thereof and may, e.g., be round. At the bottom, the inner periphery closely conforms to the shape of the image field, e.g., rectangular, though this need not be the case.

The liquid is contained in the space 11 by a gas seal 16 which, during use, is formed between the bottom of the fluid confinement structure 12 and the surface of the substrate W. The gas seal is formed by gas, e.g. air or synthetic air but, in an embodiment, $N_2$ or another inert gas. The gas in the gas seal is provided under pressure via inlet 15 to the gap between fluid confinement structure 12 and substrate W. The gas is extracted via outlet 14. The overpressure on the gas inlet 15, vacuum level on the outlet 14 and geometry of the gap are arranged so that there is a high-velocity gas flow 16 inwardly that confines the liquid. The force of the gas on the liquid between the fluid confinement structure 12 and the substrate W contains the liquid in a space 11. The inlets/outlets may be annular grooves which surround the space 11. The annular grooves may be continuous or discontinuous. The flow of gas 16 is effective to contain the liquid in the space 11. Such a system is disclosed in United States patent application publication no. US 2004-0207824.

An embodiment of the invention may be used in any lithographic apparatus, particularly an immersion apparatus irrespective of the sort of liquid supply used. The example of FIG. 5 is a so called localized area arrangement in which liquid is only provided to a localized portion (i.e., area) of the top surface of the substrate W at any one time. In an embodiment, the liquid handling system may have an opening, such as an outlet, covered with a porous member.

Other arrangements and variations are possible, including fluid handling systems which make use of a single phase extractor (whether or not it works in two phase mode) as disclosed, for example, in United States patent application publication no US 2006-0038968. In this regard, it will be noted that an embodiment of a single phase extractor may work in two phase mode. In an embodiment, a single phase extractor may comprise an inlet which is covered in a porous material, e.g. a porous member which may be in the form of a plate. The porous material is used to separate liquid from gas to enable single-liquid phase liquid extraction. A chamber downstream of the porous material is maintained at a slight under pressure and is filled with liquid. The under pressure in the chamber is such that the meniscuses formed in the holes of the porous material prevent ambient gas from being drawn into the chamber. However, when the porous surface comes into contact with liquid there is no meniscus to restrict flow and the liquid can flow freely into the chamber. The porous material has a large number of small holes, e.g. of diameter in the range of 5 to 50 μm. In an embodiment, the porous material is at least slightly liquidphilic (e.g., hydrophilic in the presence of water), i.e. having a contact angle of less than 90° to the immersion liquid, e.g. water.

Another arrangement or variant is one which works on a gas drag principle. The so-called gas drag principle has been described, for example, in United States patent application publication no. US 2008-0212046 and U.S. patent application no. U.S. 61/071,621 filed on 8 May 2008. In that system the extraction openings (e.g., holes) are arranged in a shape which desirably has a corner. The corner may be aligned with the stepping and scanning directions. This reduces the force on the meniscus between two openings in the surface of the fluid handing structure for a given relative velocity between the substrate table WT (including the substrate W) and the fluid confinement structure in the step or scan direction compared to if the two outlets were aligned perpendicular to the direction of scan.

An embodiment of the invention could be applied to a fluid handling structure used in an all wet immersion apparatus. In the all wet embodiment, fluid is allowed to cover substantially the whole of the top surface of the substrate table, for example, by allowing liquid to leak out of a confinement structure which confines liquid to between the final element of projection system and the substrate. An example of a fluid handling structure for an all wet embodiment can be found in U.S. patent application no. U.S. 61/136,380 filed on 2 Sep. 2008.

Other arrangements are possible and, as will be clear from the description below, it is not important what type of liquid supply system or liquid confinement system is used or the precise construction of such a system.

Figure 6:
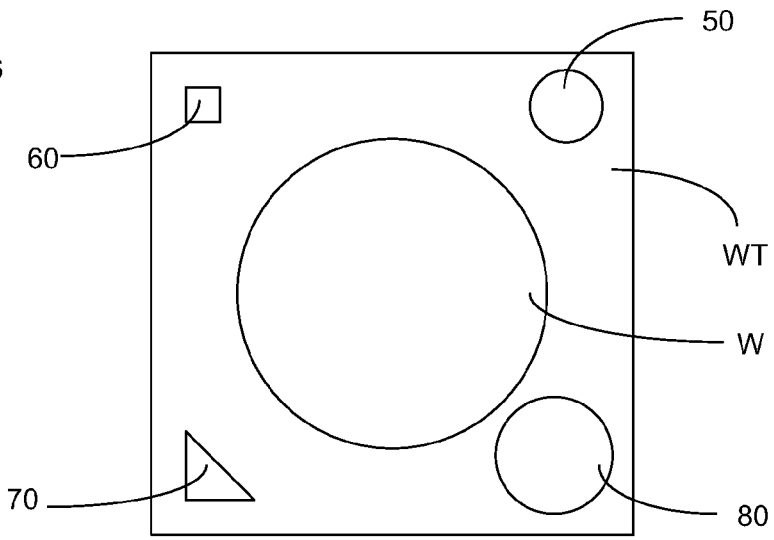
FIG. 6 illustrates, in plan, the top surface of a substrate table.

FIG. 6 illustrates, in plan, the top surface of a substrate table WT. The substrate table WT supports the substrate W. The substrate table WT may support a closing disk or dummy substrate 80. Several sensors 50, 60, 70 may be present on the top surface of the substrate table WT.

The closing disk 80 has a size greater than the cross-sectional area of the fluid confinement structure 12, for example, a greater area than a radially inward rim of the aperture defined in the undersurface of the fluid confinement structure 12. The closing disk may be larger than the undersurface area of the fluid confinement structure 12. The use of the closing disk allows the aperture to be blocked (i.e. shut) by positioning the closing disk 80 under the liquid confinement structure. The closing disk 80 may or may not be releasable from the substrate table WT. In this way it is possible to maintain the flow of liquid through the space 10 during, for example, substrate swap.

The closing disk may operate as a shutter member. Other embodiments of a shutter member may include (in a non-limiting list): a separate table such as a further substrate table or a second table such as a cleaning table, a measurement table or both measurement and cleaning table; or an assembly with a surface interconnecting the surfaces of two tables during, for example, substrate swap, so the tables may be moved smoothly under the fluid confinement structure 12. Such an assembly may be referred to as a retractable bridge, and the bridge may be moved into position for, e.g., substrate swap. A cleaning table may have a component to clean a part of the immersion system. A measurement table may have a sensor to measure a parameter of, for example, the projection system. A cleaning and a measurement table may each be configured to support a substrate or be configured so as to be unable to support a substrate.

During use of an immersion lithographic apparatus, one or more sensors 50, 60, 70, which are mounted on the top surface of the substrate table WT are used to make certain measurements. The sensors may be used to make measurements of, for example, the projection system PS, the substrate W, and/or the substrate table WT. The sensors 50, 60, 70 may include a transmission image sensor (TIS), a lens interferometer (ILIAS), a spot sensor, etc. One or more of these sensors may be covered with immersion liquid, for example, when imaging a sensor to take a measurement using the sensor. Liquid may be left on a sensor by the fluid confinement structure 12 as the sensor passes under the fluid confinement structure 12. Liquid left on a surface, such as the sensor, may evaporate, applying a heat load to the surface. The heat load may cause the surface to deform. Liquid left on a sensor may be heated by exposing radiation, affecting the refractive index of the liquid and the optical properties of the liquid. Liquid remaining on a sensor can cause a contaminant to adhere to a surface of the sensor. Such a contaminant may be present in the immersion liquid, or may form as a consequence of the interaction of the liquid (e.g., water) with material present in a surface of the immersion apparatus, perhaps under the influence of illuminating radiation.

Contamination, liquid, excess heat, individually or in any combination, on a sensor can therefore deleteriously affect its measurement performance. Another component can also suffer from being so contaminated, and/or heated. Such a component may include, in a non-limiting list: an opening to supply or extract immersion fluid in a single fluid phase or in a two phase fluid; and/or an encoder marking which may be present on the surface of a table, such as a substrate table.

In order to make the immersion liquid exposed surface of a substrate table and/or other component (e.g., a sensor 50, 60, 70 mounted on the substrate table WT) liquidphobic to the immersion liquid, the material of, or applied to, the surface is liquidphobic. Such a surface material, e.g. a coating, can degrade in ultraviolet (UV) radiation (for example, the wavelength of radiation typically used in immersion lithography is 193 nm and a liquidphobic material can degrade in radiation of that wavelength and the degradation may occur particularly in the presence of immersion liquid such as water). The term 'degrade' means that a desirable property of the surface material is removed by irradiation. Such removal may occur gradually and may occur with increased exposure to the UV radiation. The term contrasts to the case of photoresist which is sensitive to radiation and has a property changed by radiation, but cannot be said to degrade (because the change in property is a positive and desired attribute). In addition, the time response of the photoresist is much faster than the previously mentioned surface material: the time it takes to expose a single die and not hundreds of substrates of dies.

A reason for having a liquidphobic surface material (e.g. coating) is to increase the relative speed between the substrate table WT and the projection system PS and confinement structure 12. During scanning, the substrate table WT may be moved underneath and relative to the projection system PS and the liquid confinement system 12. The meniscus of the immersion liquid has as a higher receding contact angle on a surface with a greater liquidphobic property. Such a contact angle between the meniscus and the surface covered by the liquid may be ninety degrees or more. A higher receding contact angle is indicative of greater meniscus stability. Greater meniscus stability enables faster speeds of relative movement of the substrate table WT and/or substrate W and the liquid confined in the confinement structure 12 in the space 11. The liquidphobic surface may help to maintain meniscus stability. Thereby the risk of droplets forming on, for example, the substrate and causing bubbles to form in the reservoir 11 between the projection system PS and the substrate W is reduced. Thus the use of a liquidphobic coating may help to achieve a higher scan speed.

The following description refers to a TIS 50 as an example of how an embodiment of the invention may be applied to a sensor. This description is intended not to limit the invention to this type of sensor in any way. The description is intended merely to indicate the aspects of an embodiment of invention and how they can be applied to a component feature of an immersion lithographic apparatus.

Figure 7:
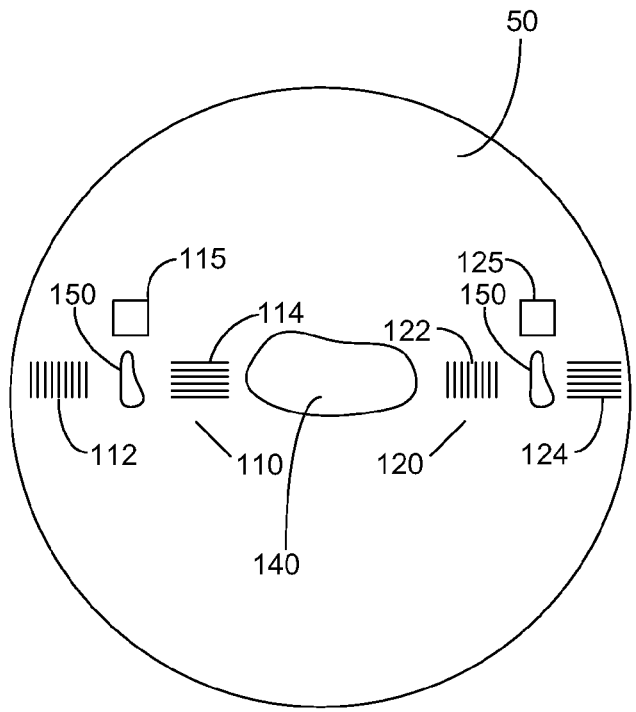
FIG. 7 illustrates, in plan, the top surface of a TIS sensor.

FIG. 7 illustrates, in plan, the top surface of a TIS 50. A TIS is made up of at least two TIS marks 110, 120. The TIS marks 110, 120 are spaced apart in the x direction. Each of the TIS marks 110, 120 includes two gratings 112, 114, 122, 124. Each of the TIS marks 110, 120 additionally comprises blocks 115, 125. Each part of the sensor to be illuminated (the TIS marks 110, 120, or more specifically the blocks 115, 125 and gratings 112, 114, 122, 124) may be regarded as a target portion.

The TIS comprises a transparent plate on which an opaque coating is formed. The opaque coating may be chrome. The opaque coating may be patterned. Under the transparent plate is a luminescent layer which luminesces when irradiated with irradiation from a beam of radiation (e.g., beam B). Under the luminescent layer is a photodiode.

Blocks 115, 125 each comprise areas which are not coated by the opaque coating. The blocks 115, 125 are part of the patterning of the opaque coating on the transparent plate. Therefore, when a beam illuminates the block 115 the photodiode under the block 115, 125 will receive a large luminescence radiation. When the luminescence radiation is of sufficient intensity, the diode operates to cause an electrical circuit to which the diode is connected to emit a signal. This arrangement may be used in a positioning system of a lithographic apparatus. In particular this arrangement can be used, e.g., for coarse positioning of the substrate table WT relative to the projection system PS.

Gratings 112 and 122 have an x alignment mark containing vertical gratings. Gratings 114 and 124 have a y alignment mark containing horizontal gratings.

The patterning device MA comprises alignment marks M1, M2 as illustrated in FIG. 1. The patterning device MA and in particular alignment marks M1, M2 are illuminated using a radiation beam to form a pattern in the cross-section of the radiation beam before it impinges on the TIS 50. The pattern in the cross-section of the radiation beam is substantially the same as the pattern of gratings 112, 114, 122, 124. The pattern of each grating 112, 114, 122, 124 is part of the patterning of the opaque coating on the transparent plate. At least one, and possibly all, of the four gratings 112, 114, 122, 124 are illuminated at the same time. The substrate table WT is then moved in the x/y plane until best alignment between the patterning device MA and the substrate table WT is achieved. Desirably the best alignment is an optimized alignment. The best alignment may be indicated by the alignment between the alignment marks M1, M2 on the patterning device MA and the gratings 112, 114, 122, 124 of the TIS 50. The alignment is determined by the signal received from the photodiode under each of the gratings 112, 114, 122, 124. The substrate table WT may be moved in the z direction to determine, e.g., optimum focus in a similar way.

A liquidphobic, for example hydrophobic, coating may be provided over the top surface of the TIS 50. The liquidphobic coating may be transparent. The liquidphobic surface loses its liquidphobic property on irradiation with UV radiation (i.e. degrades) as described above to lower its contact angle. The surface may become liquidphilic, for example hydrophilic. This can be tolerated over the TIS marks 110, 120, in particular over the block 115, 125, and sometimes over the gratings 112, 114, 122, 124. However, loss of contact angle can lead to a difficulty elsewhere on the sensor. For example, an area 140 between the TIS marks 110, 120 and/or an area 150 between gratings 112, 114 and block 115 or between gratings 122, 124 and block 125 could undesirably lose contact angle and may become liquidphilic if irradiated with UV radiation. The degradation may be more noted if the irradiation occurs in the presence of immersion liquid, such as water.

Additionally or in the alternative, the illuminating UV radiation may heat up the surface of the sensor, e.g. the TIS 50. The increase in the sensor surface temperature may cause the sensor to deform inducing errors in the measurements made by the sensor. For example, the increase in temperature may affect the distance between the marks 110, 120 and/or an area 150 between the gratings 112, 114 and block 115 or between gratings 122, 124 and block 125. In these locations the heat will distort the surface because this part of the surface is not made of a material with a low effective thermal coefficient of expansion. Such a material may absorb exposure radiation, reflect exposure radiation or both. The material may be a radiation absorber or reflector. Such a material may comprise or consist of chrome, or molybdenum silica (e.g. MoSi), or both.

At least some of the features of the sensor 50 surface may function in use as an aperture for incidental radiation during measurement of a property of the radiation. For example the aperture may be used to scan an aerial image of, for example, radiation patterned with a marker, directed at the sensor. Such a configuration may be used during alignment of a patterning device MA such as a reticle or mask. The same material may be used to form the surface around the aperture as the material used to form the features on the patterning device MA. So a material which has a low thermal coefficient of expansion may be present in at least one of the marks 110, 120, gratings 112, 114, 122, 124 and block 115, 125. Radiation of these components is less likely to lead to deformation of the sensor.

Immersion liquid present on the sensor, e.g. TIS 50, will be heated by the exposing radiation. The liquid may evaporate, applying a heat load to the sensor. As it heats the refractive index of the liquid changes, which may affect its optical properties, and may affect measurements made through the liquid. Additionally or in the alternative, the heated liquid may be returned to the immersion liquid confined in the liquid confinement structure 12, i.e. in space 11. The heated liquid may affect the temperature of the conditioned immersion liquid confined in the liquid confinement structure which is supplied directly to the space 11. Mixing of the heated liquid with the conditioned immersion liquid may affect the optical properties of the immersion liquid confined in the space.

In an embodiment the surface of the sensor may be receive a thermal load from the radiation beam. The surface of the sensor may be exposed to the radiation beam before liquid contacts the surface. During operation of the sensor 50 the immersion space may be located above the sensor. Liquid in the immersion space 11 is thermally conditioned. So the optical properties of the liquid are controlled. Heat may readily transfer between the surface of the sensor and the immersion liquid; there may be effective and efficient thermal conduction between the surface and the liquid. The beam may heat the immersion liquid directly. As heat is transferred to the liquid its refractive index changes. The liquid may flow over the surface to another part of the immersion space 11, for example into the liquid in an optical path of the radiation beam. A radiation beam may pass along the optical path, through the immersion space 11, so that a measurement may be taken using the sensor for example during alignment of the patterning device.

As liquid flows over the heated surface towards and through the optical path, its temperature and refractive index may be affected. The thermal stability of the immersion liquid in the space 11 may be affected. The optical properties of the immersion liquid may be compromised, e.g. distorted, introducing errors into the measurements made using the sensor.

As can be seen from FIG. 1, the alignment marks M1, M2 on the patterning device MA are separated by a distance at the side of the device pattern C. The separation of the alignment marks M1, M2 may be large enough for accurate and/or reliable rotational alignment between the patterning device MA and the substrate table WT to be achieved. A customer is free to use the area between the two alignment marks M1, M2 as they wish, for example for other marks. However, if a customer takes advantage of this, it results, in radiation passing through the patterning device MA onto area 140 during illumination of the TIS marks 110, 120 of the TIS. Such radiation onto area 140 can lead to degradation of the surface material (which may be a coating) of area 140. Such degradation is undesirable. In a conventional apparatus, it cannot be guaranteed that radiation does not reach areas 140 or 150.

In an embodiment of the invention, a shield is used in the optical path of the radiation beam directed toward an area which it is desired to be illuminated with the radiation beam. The shield is used to block radiation from reaching the surface adjacent to, or even adjoining, that area. In an embodiment, the shield is used to restrict illumination of (e.g. block the radiation beam from reaching) area 140 between alignment marks 110, 120 and/or illumination of area 150 between gratings 112, 114 and/or between gratings 120, 124. Desirably the shield is moveable such that it can be moved out of the optical path during illumination of a substrate W.

FIG. 8 illustrates an embodiment of a shield which is moveable into the optical path. In use, the shield blocks a portion of the cross-section of the radiation beam directed toward an area which it is desired to be illuminated with the radiation beam, e.g., any of gratings 112, 114, 120, 124 and/or any of blocks 115, 125. In this way during use, illumination of, for example, the area 150 between at least two TIS marks 110, 120 of the sensor 50 is restricted. Illumination of liquid present on the area 150 may also be restricted in this way. FIG. 8 illustrates top and bottom framing members 210, 220 which are used to limit the cross-section of the radiation beam during irradiation of a substrate W in the y direction. Such framing members 210, 220 are positioned in the optical path of the beam after the illumination system IL and before the patterning device MA and the projection system PS. That is, the framing members may be positioned at an intermediate focal plane in the optical path between the illumination system IL and the patterning device MA. Other locations may be appropriate, particularly at any intermediate focal plane. Other framing members may be present, particularly for framing in the x direction. Such framing members would have their edges positioned substantially perpendicularly to facing edges 211, 221 of the two framing members 210', 220 illustrated in FIG. 8.

The framing members 210, 220, during normal operation, are used to define the cross-section of the beam, such as before the radiation beam passes through the patterning device MA. In an embodiment of the invention the framing members 210, 220 are made large enough such that they can be brought together such that their inner most edges 211, 221, which face each other can touch.

In one of the framing members 210, 220, through holes (or openings) 301, 302, 303, 311, 312, 313 are defined. The through holes are defined in a part of the framing member 210, 220 which is not used for framing the radiation beam B during normal operation. The through holes 301, 302, 303, 311, 312, 313 correspond in position to grating 112, block 115, grating 114, grating 122, block 125, grating 124 respectively on the TIS. Therefore only radiation which is to impinge on the gratings 112, 114, 122, 124 and the blocks 115, 125 of the TIS, and optionally liquid present on these areas, is not blocked by the framing member. Therefore the framing member restricts illumination of the areas 140, 150 between the TIS marks 110; 120 and between the gratings and blocks in each individual TIS mark. Thus, the sensor may be designed so that features which are desirably not illuminated by a beam of radiation when the TIS marks 110, 120 are illuminated can be positioned in an area 140 and/or 150 between the two TIS marks 110, 120. Thus, those features may be moved to a desired position and/or the size of the sensor may be reduced.

In use, the framing members 210, 220 may be used as normal during illumination and patterning of the substrate W. However, during alignment of the patterning device MA to the TIS (and thereby the substrate table WT) one of the framing members 210 (which may be referred to as a blade) is moved further into the cross-section of a beam of radiation. In an embodiment, the framing member 210 with through holes is moved across the path of the radiation beam. In an embodiment, both framing members 210, 220 may be in the path of the radiation beam. One or more of the framing members 210, 220 may be moved so that their opposing edges 211, 221 meet. Alternatively, the framing members 210, 220 are moved in the same direction, so that the opposing edges 211, 221 do not meet.

In this way radiation that impinges on one or more of the blocks 115, 125 and/or on one or more of the gratings 112, 114, 122, 124 passes through the framing member 210, for example through the respective corresponding through holes 301, 302, 303, 311, 312, 313. However, other radiation is restricted.

After the beam of radiation has passed through the through holes 301, 302, 303, 311, 312, 313, the radiation may pass through the patterning device MA. In particular the radiation may pass through alignment marks M1, M2 to be patterned, as necessary, for use with the TIS. Thus a property (e.g. position relative to the patterning device MA) may be detected/measured.

The through holes 301, 302, 303, 311, 312, 313 could be provided in more than one framing member.

Other positions of the shield or framing member 210, 220 in the optical path of the beam of radiation B may be suitable. For example, the shield or framing member 210, 220 may be positioned in the optical path at an intermediate focal plane before the illumination system IL, in the illumination system IL, between the illumination system IL and the projection system PS, in the projection system PS or after the projection system PS. In an embodiment, the shield member may be a patterning device MA patterned to pattern the beam on the relevant portions of the sensor, e.g., one or more of the blocks 115, 125 and/or on one or more of the gratings 112, 114, 122, 124. This may be less desirable than using the framing members 210, 220 because extra time may be used to replace the patterning device with the patterning device to pattern the radiation beam during exposure of a substrate W.

An advantage may be achieved if only the area 140 between the two TIS marks 110, 120 (and desirably the area surrounding the two TIS marks 110, 120), and optionally liquid present on the area 140, is shielded. An embodiment of the invention provides a benefit if, for example, only the area 150 between gratings 112, 114 and between grating 112 and block 115, and optionally liquid present on the area 150, is shielded.

Limiting the area of the surface, for example of the sensor, exposed to the beam (i.e. shielding a portion of the surface) may be desirable for one or more of the following reasons. Limiting the area exposed to radiation may help limit degradation of a material present on the surface. By limiting the area of the surface exposed to the illuminating radiation, the risk of distortion of the surface may be reduced. If liquid is present on the surface, by limiting the surface and the volume of immersion liquid exposed to the radiation beam, the heat transferred to the immersion liquid in the space during measurement may be reduced. This is desirable when the surface is the surface of the sensor to achieve better alignment of the patterning device with the substrate table and/or substrate.

An embodiment of the invention may be desirable for use during illumination of a components other than a TIS. For example, illumination of another type of sensor or other feature of an immersion lithographic apparatus that may benefit from shielding adjacent or even adjoining surfaces to the target portion being illuminated. For example, a suitable feature could be an encoder marking which may be present on a substrate table, for example one or more edges of the table. The feature may have a defined surface which needs illumination by a radiation beam and the defined surface is adjacent to or even adjoins a surface made of a material, such as a coating, which has a selected or defined contact angle property which may require protection from irradiation by the radiation beam. An embodiment of the invention can be used for such circumstances.

In an embodiment, the shield member, e.g. one of the framing members 210, 220, has one through hole which imparts on a radiation beam a cross-sectional shape corresponding to the target portion to be illuminated. However, a target portion may be located close to another target portion, as in the TIS. In such a case, the shield member has a plurality of through holes, each throughhole corresponding to a target portion in the path of the radiation beam. Each hole, or opening, may be arranged to direct radiation to a location which may correspond to a part of a surface of the sensor which has a relatively low effective thermal coefficient of expansion. The material around such a location may have a relatively high effective thermal coefficient of expansion (e.g. it is not a reflector). So each hole may be associated with a portion of a surface made of a material which has a low effective thermal coefficient of expansion in a surface made of a material which has a higher, noticeable, effective thermal coefficient of expansion.

An embodiment of the invention may be used during cleaning of a feature which may be placed underneath a radiation beam (e.g., beam B), such as the sensor 50 (see U.S. patent application No. U.S. 61/064,487 filed 7 Mar. 2008 for an example of how this can be implemented). That is, during cleaning it may be desirable to illuminate a target portion but not an area around the target portion, for example at least two target portions but not an area between the target portions (i.e. between at least two of the target portions). The cleaning is thus restricted to the portion of the sensor which it is intended to be cleaned.

It will be appreciated that the above description makes reference to a material being hydrophobic or hydrophilic. This is relevant to the case where the immersion liquid used is water. However, another liquid or fluid may be used as the immersion liquid. In this case the terms hydrophobic and hydrophilic should be read as being liquidphobic or liquidphilic or lipophobic or lipophilic. Liquidphobic (for example, hydrophobic in the presence of water) means a receding contact angle of greater than 90°, desirably greater than 100, 120, 130 or 140°. The contact angle in one embodiment is less than 180°. Liquidphilic (for example hydrophilic in the presence of water) means a receding contact angle of less than 90°, desirably less than 80°, less than 70°, less than 60° or less than 50°. In one embodiment the contact angle is more than 0°, desirably more than 10°. These angles may be measured at room temperature (20° C.) and atmospheric pressure.

As will be appreciated, any of the above described features can be used with any other feature and it is not only those combinations explicitly described which are covered in this application.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of or about 365, 248, 193, 157 or 126 nm). The term "lens", where the context allows, may refer to any one or combination of various types of optical components, including refractive and reflective optical components.

While specific embodiments of the invention have been described above, it will be appreciated that the invention may be practiced otherwise than as described. For example, the embodiments of the invention may take the form of a computer program containing one or more sequences of machine-readable instructions describing a method as disclosed above, or a data storage medium (e.g. semiconductor memory, magnetic or optical disk) having such a computer program stored therein. Further, the machine readable instruction may be embodied in two or more computer programs. The two or more computer programs may be stored on one or more different memories and/or data storage media.

The controllers described herein may each or in combination be operable when the one or more computer programs are read by one or more computer processors located within at least one component of the lithographic apparatus. The controllers may each or in combination have any suitable configuration for receiving, processing, and sending signals. One or more processors are configured to communicate with the at least one of the controllers. For example, each controller may include one or more processors for executing the computer programs that include machine-readable instructions for the methods described above. The controllers may include data storage medium for storing such computer programs, and/or hardware to receive such medium. So the controller(s) may operate according the machine readable instructions of one or more computer programs.

One or more embodiments of the invention may be applied to any immersion lithography apparatus, in particular, but not exclusively, those types mentioned above and whether the immersion liquid is provided in the form of a bath, only on a localized surface area of the substrate, or is unconfined. In an unconfined arrangement, the immersion liquid may flow over the surface of the substrate and/or substrate table so that substantially the entire uncovered surface of the substrate table and/or substrate is wetted. In such an unconfined immersion system, the liquid supply system may not confine the immersion fluid or it may provide a proportion of immersion liquid confinement, but not substantially complete confinement of the immersion liquid.

A liquid supply system as contemplated herein should be broadly construed. In certain embodiments, it may be a mechanism or combination of structures that provides a liquid to a space between the projection system and the substrate and/or substrate table. It may comprise a combination of one or more structures, one or more fluid openings including one or more liquid openings, one or more gas openings or one or more openings for two phase flow. The openings may each be an inlet into the immersion space (or an outlet from a fluid handling structure) or an outlet out of the immersion space (or an inlet into the fluid handling structure). In an embodiment, a surface of the space may be a portion of the substrate and/or substrate table, or a surface of the space may completely cover a surface of the substrate and/or substrate table, or the space may envelop the substrate and/or substrate table. The liquid supply system may optionally further include one or more elements to control the position, quantity, quality, shape, flow rate or any other features of the liquid.

In an embodiment there is provided a lithographic apparatus comprising: a table, at least two target portions, an optical system and a shield. The at least two target portions are on the table or on an object on the table. There is a surface material between the at least two target portions. The optical system is configured to project a beam of radiation, along an optical path towards the table, with a cross-section to irradiate the at least two target portions at the same time. The shield is moveable into the optical path to restrict the cross-section of the beam of radiation to restrict illumination between the at least two target portions. The surface material between the at least two target portions, when irradiated with radiation from the optical system, would: degrade, or deform, or both degrade and deform.

The shield may be positioned in the beam upstream of a support structure. The support structure may be configured to support a patterning device to impart a pattern into the cross-section of the beam of radiation.

The shield may comprise a framing member to limit the cross-section of a beam of radiation during irradiation of a substrate. The framing member may be configured to limit the cross-section during scanning. The framing member may have a hole in it to allow radiation to pass therethrough onto at least one of the at least two target portions. The hole may be in a part of the framing member not used to limit the cross-section of the beam of radiation during irradiation of a substrate.

The optical system may include an illumination system and a projection system. The shield may be positioned in the optical path at an intermediate focal plane: before the illumination system, in the illumination system, between the illumination system and the projection system, in the projection system or after the projection system.

At least one of the at least two target portions may be adjacent an area which degrades when irradiated with radiation from the optical system. The at least two target portions may be part of a sensor. The sensor may be a transmission image sensor. At least one of the at least two target portions, in use, may be illuminated with a pattern which has been imparted to the beam of radiation by a patterning device. The surface between the at least two target portions may be liquidphobic which, upon extended illumination with radiation from the optical system, may have a contact angle which decreases. A coating may be present between the at least two target portions.

The shield may be configured to block a part of the cross-section of the beam of radiation.

In an embodiment, the surface material between the at least two target portions would deform when heated up by radiation from the optical system, together with any immersion liquid present on the surface material.

In an embodiment, there is provided a method of irradiating at least two target portions of a table or of an object on a table in a lithography apparatus. A surface material between the at least two target portions degrades when irradiated. The method comprises projecting and restricting. In the projecting, a beam of radiation is projected towards the target portions, the beam of radiation having a cross-section large enough to irradiate the at least two target portions at the same time. In the restricting, the cross-section of the radiation beam is restricted to restrict illumination of the surface material between the at least two target portions.

The restricting may be blocking. The method may further comprise imparting a pattern to the restricted cross-section of the beam of radiation. The method may further comprise moving the table to vary the position of impingement of the beam of radiation on the at least two target portions. The method may further comprise detecting a variation in a signal resulting from the impingement of the beam of radiation onto the target portion. The method may further comprise determining a position and/or degree of focus based on the signal.

In an embodiment, there is provided a method of irradiating at least two target portions of a table or of an object on a table in a lithography apparatus. A surface material between the at least two target portions may deform when irradiated. The method comprises projecting and restricting. In the projecting, a beam of radiation is projected towards the target portions. The beam of radiation has a cross-section large enough to irradiate the at least two target portions at the same time. In the restricting, the cross-section of the radiation beam is restricted to restrict illumination of the surface material between the at least two target portions.

In an embodiment, there is provided a method of cleaning at least two target portions by irradiating them with a beam of radiation using a method as described herein.

In an embodiment, there is provided a framing member configured to limit the cross-section of a beam of radiation in an optical system of a lithographic apparatus. The framing member has a hole in it to allow radiation to pass therethrough. The hole is positioned in a portion of the framing member not needed to limit the cross-section of a beam of radiation during imaging of a substrate.

In an embodiment, there is provided a lithographic apparatus comprising: a table, an optical system, a framing member and a target portion. The optical system is configured to project a beam of radiation along an optical path towards the table. The target portion is located on the table or on an object supported by the table. A surface material is adjacent to the target portion. The surface material is degradable when irradiated with radiation from the optical system. The framing member is constructed and arranged to be moveable into the optical path. The framing member has an opening through a body of the framing member. When the framing member is in the optical path, the radiation beam passes through the opening. The opening is configured to limit the cross-section of the beam of radiation to restrict irradiation by the radiation beam to the target portion.

The apparatus may further comprise a support structure configured to hold a patterning device to pattern the beam of radiation from the optical system. The framing member may be configured to limit the cross-section of the beam of radiation before the beam of radiation reaches the patterning device. The degradation may occur in the presence of immersion liquid. The framing member may be part of a framing assembly constructed and arranged to frame a beam of radiation during imaging.

In an embodiment, there is provided a method of irradiating a target portion located on the table or on an object supported by the table. A surface material is adjacent to the target portion. The surface material is degradable when irradiated. The method comprises projecting and moving. In the projecting, a beam of radiation is projected towards the target portion. In the moving, a framing member is moved into the path of the beam of radiation so that the cross-section of the beam of radiation is limited by an opening defined in the framing member to restrict irradiation by the beam of radiation to the target portion.

In an embodiment, there is provided a method of detecting a property of a substrate table in a lithography apparatus comprising irradiating a target portion of a sensor mounted on the substrate table using a method described herein.

The descriptions above are intended to be illustrative, not limiting. Thus, it will be apparent to one skilled in the art that modifications may be made to the invention as described without departing from the scope of the claims set out below.

The invention claimed is:

1. A lithographic apparatus comprising:
   a table;
   at least two target portions on the table or on an object on the table, and a surface material between the at least two target portions, the target portions not being on a resist-coated substrate;
   an optical system configured to project a beam of radiation, along an optical path towards the table, with a cross-section to irradiate the at least two target portions at the same time; and
   a shield, spaced apart from the table, moveable into the optical path to restrict the cross-section of the beam of radiation to restrict illumination of a location between the at least two target portions when the at least two target portions are irradiated at the same time, wherein the surface material at the location between the at least two target portions, when irradiated with radiation from the optical system, would: degrade, or deform, or both degrade and deform.

2. The apparatus of claim 1, wherein the shield is positioned, in the beam path, upstream of a support structure configured to support a patterning device to impart a pattern into the cross-section of the beam of radiation.

3. The apparatus of claim 1, wherein the shield comprises a framing member to limit the cross-section of a beam of radiation during irradiation of a substrate.

4. The apparatus of claim 3, wherein the framing member is configured to limit the cross-section during scanning.

5. The apparatus of claim 3, wherein the framing member has a hole in it to allow radiation to pass therethrough onto at least one of the at least two target portions.

6. The apparatus of claim 5, wherein the hole is in a part of the framing member not used to limit the cross-section of the beam of radiation during irradiation of a substrate.

7. The apparatus of claim 1, wherein the optical system includes an illumination system and a projection system and wherein the shield is positioned in the optical path at an intermediate focal plane before the illumination system, in the illumination system, between the illumination system and the projection system, in the projection system or after the projection system.

8. The apparatus of claim 1, wherein at least one of the at least two target portions is adjacent an area which degrades when irradiated with radiation from the optical system.

9. The apparatus of claim 1, wherein the at least two target portions are part of a sensor.

10. The apparatus of claim 1, wherein at least one of the at least two target portions, in use, is illuminated with a pattern which has been imparted to the beam of radiation by a patterning device.

11. The apparatus of claim 1, wherein the surface between the at least two target portions is liquidphobic which, upon extended illumination with radiation from the optical system, has a contact angle which decreases.

12. The apparatus of claim 1, wherein a coating is present between the at least two target portions.

13. The apparatus of claim 1, wherein the shield is configured to block a part of the cross-section of the beam of radiation.

14. A method of irradiating at least two target portions of a table or of an object on a table in a lithography apparatus, wherein a surface material between the at least two target portions degrades when irradiated and the target portions are not on a resist-coated substrate, the method comprising:

projecting a beam of radiation towards the target portions, the beam of radiation having a cross-section large enough to irradiate the at least two target portions at the same time; and restricting, at a location spaced away from the table, the cross-section of the radiation beam to restrict illumination of the surface material between the at least two target portions.

15. A method of cleaning at least two target portions by irradiating them with a beam of radiation using the method of claim 14.

16. A method of irradiating at least two target portions of a table or of an object on a table in a lithography apparatus, wherein a surface material between the at least two target portions deforms when irradiated and the target portions are not on a resist-coated substrate, the method comprising:

projecting a beam of radiation towards the target portions, the beam of radiation having a cross-section large enough to irradiate the at least two target portions at the same time; and restricting, at a location spaced away from the table, the cross-section of the radiation beam to restrict illumination of the surface material between the at least two target portions.

17. A framing member configured to limit, in an optical system of a lithographic apparatus, the cross-section of a beam of radiation to impinge a substrate, supported by a substrate table, to pattern the substrate, the framing member being, in use, spaced apart from the substrate table and away from a patterning device which imparts a pattern to the beam of radiation, the framing member having a hole in it to allow radiation to pass therethrough, the hole positioned in a portion of the framing member not needed to limit the cross-section of the beam of radiation during imaging of the substrate.

18. A lithographic apparatus comprising:
a table;
an optical system configured to project a beam of radiation along an optical path towards the table;
a target portion located on the table or on an object supported by the table, wherein the target portion is not on a resist-coated substrate and a surface material is adjacent to the target portion, the surface material being degradable when irradiated with radiation from the optical system; and
a framing member constructed and arranged to be moveable into the optical path and spaced apart from the table, the framing member having an opening through a body of the framing member, wherein, when the framing member is in the optical path, the radiation beam passes through the opening and the opening is configured to limit the cross-section of the beam of radiation to restrict irradiation by the radiation beam to the target portion.

19. A method of irradiating a target portion located on the table or on an object supported by the table, wherein the target portion is not on a resist-coated substrate and a surface material is adjacent to the target portion, the surface material being degradable when irradiated, the method comprising:

projecting a beam of radiation towards the target portion; and moving a framing member, spaced apart from the table, into the path of the beam of radiation so that the cross-section of the beam of radiation is limited by an opening defined in the framing member to restrict irradiation by the beam of radiation to the target portion.

20. A method of detecting a property of a substrate table in a lithography apparatus comprising irradiating a target portion of a sensor mounted on the substrate table using the method of claim 19.

\* \* \* \* \*